(12) United States Patent
Huang et al.

(10) Patent No.: US 9,142,761 B2
(45) Date of Patent: Sep. 22, 2015

(54) METHOD FOR FABRICATING A MAGNETIC TUNNEL JUNCTION DEVICE

(71) Applicant: Taiwan Semiconductor Manufacturing Company, Ltd., Hsin-Chu (TW)

(72) Inventors: Wei-Hang Huang, Kaohsiung (TW); Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/013,943

(22) Filed: Aug. 29, 2013

(65) Prior Publication Data

US 2015/0061051 A1    Mar. 5, 2015

(51) Int. Cl.
*H01L 43/08*    (2006.01)
*H01L 43/12*    (2006.01)
*H01L 43/02*    (2006.01)
*H01L 43/10*    (2006.01)

(52) U.S. Cl.
CPC ............... *H01L 43/12* (2013.01); *H01L 43/08* (2013.01); *H01L 43/10* (2013.01)

(58) Field of Classification Search
CPC .................................. H01L 43/12; H01L 43/02
USPC ...................... 438/3; 257/421; 365/33, 50, 97
See application file for complete search history.

(56) References Cited

U.S. PATENT DOCUMENTS

2010/0311243 A1*  12/2010  Mao ............................... 438/694
2011/0189796 A1*   8/2011  Lu et al. ........................... 438/3
2013/0302912 A1*  11/2013  Zhong et al. ..................... 438/3

* cited by examiner

*Primary Examiner* — Selim Ahmed
*Assistant Examiner* — Changhyun Yi
(74) *Attorney, Agent, or Firm* — Slater & Matsil, L.L.P.

(57) ABSTRACT

A method includes creating an opening in a dielectric layer that is disposed over a bottom electrode layer. A top electrode layer is disposed over the dielectric layer. A magnetic tunnel junction (MTJ) layer is formed in the opening over the bottom electrode layer.

20 Claims, 3 Drawing Sheets

METHOD FOR FABRICATING A MAGNETIC TUNNEL JUNCTION DEVICE

TECHNICAL FIELD

The present disclosure relates generally to an integrated circuit and more particularly a magnetic tunnel junction (MTJ) device.

BACKGROUND

An MTJ device includes multiple layers to store "0" and "1" signals for a memory device depending on magnetization directions of a free-layer and a pinned layer that results in different magnetic reluctance. For the MTJ device to have good performance, keeping the MTJ film free from by-product, plasma damage, and oxidation is a challenging issue.

BRIEF DESCRIPTION OF THE DRAWINGS

Reference is now made to the following descriptions taken in conjunction with the accompanying drawings, in which.

DETAILED DESCRIPTION

Figure 1B:
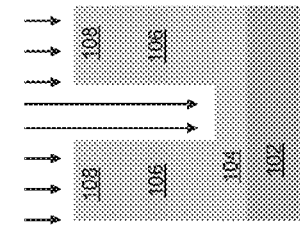
FIGS. 1A-1I are exemplary intermediate fabrication steps an exemplary MTJ device according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
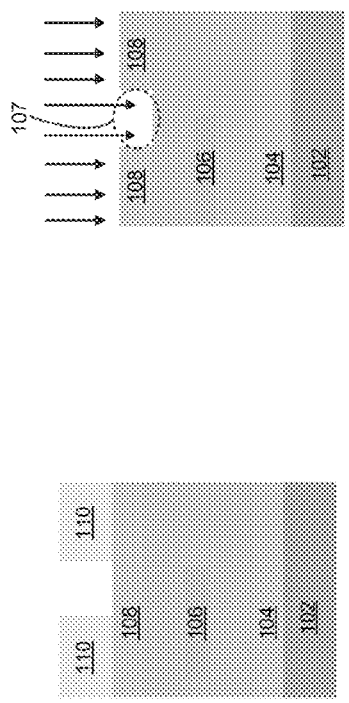

FIGS. 1A-1I are exemplary intermediate fabrication steps an exemplary MTJ device according to some embodiments. In FIG. 1A, a substrate 102 is shown with a bottom electrode layer 104, a dielectric layer 106, a top electrode layer 108, and a photoresist layer 110 disposed over the substrate 102. The substrate 102 comprises silicon, silicon dioxide, aluminum oxide, sapphire, germanium, gallium arsenide (GaAs), an alloy of silicon and germanium, indium phosphide (InP), silicon on insulator (SOI), or any other suitable material.

In some embodiments, the bottom electrode layer 104 has a thickness ranging from 150 Å to 200 Å, the top electrode layer 108 has a thickness ranging from 300 Å to 350 Å, and the bottom electrode layer 104 and the top electrode layer 108 comprise Ta. The dielectric layer 106 has a thickness ranging from 300 Å to 400 Å, and comprises $SiO_2$, SiN, or any other suitable material. The photoresist 110 is patterned on the top electrode layer 108 by a photolithography process.

In FIG. 1B, the top electrode layer 108 is etched to form an opening 107 by dry etching for example. In some embodiments, the opening 107 has a width ranging from 40 nm to 50 nm.

Figure 1C:
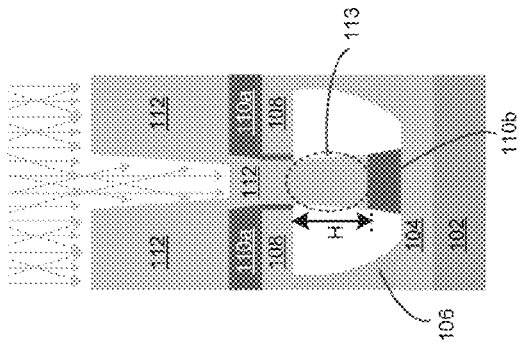

In FIG. 1C, the dielectric layer 106 is etched by dry etching, for example. This step is optional.

Figure 1D:
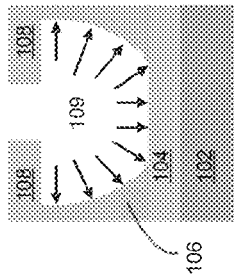

In FIG. 1D, the dielectric layer 106 is etched to form the opening 109 by wet etching using HF solution, for example. The space in the opening 109 can be formed by just wet etching in FIG. 1D, or can be formed in combination with the dry etching in FIG. 1C.

In some embodiments, the opening 109 has a bottom width that is 2-3 times of the opening 107 width of the top electrode layer 108, and the opening 109 bottom width ranges from 100 nm to 150 nm. Opening 109 may sometimes be referred to as a hollow cavity herein.

Figure 1E:
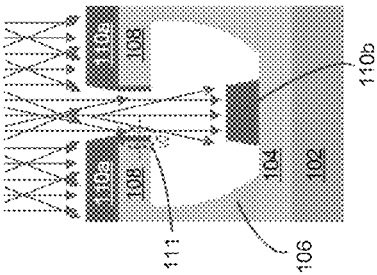

In FIG. 1E, MTJ layers 110a and 110b are deposited over the top electrode layer 108 and the bottom electrode layer 104 by physical vapor deposition (PVD), for example. MJT layers 110a and 110b are described as two layers because they are formed on different regions of the device, as shown in the figure. Note, however, that these two layers can be formed simultaneously using the same process in most embodiments. The MTJ layer 110b is formed in the opening 109 over the bottom electrode layer 104 and has a width ranging from 40 nm to 150 nm in some embodiments. The MTJ layer 110a is formed over the top electrode layer 108 at the same time. In some embodiments, the MTJ layers 110a and 110b has a thickness range from 250 Å to 300 Å.

The MTJ layers 110a and 110b include multiple layers, for example, a pinned layer comprising ferromagnetic material, a barrier layer comprising insulator material, and a free layer comprising ferromagnetic material. The ferromagnetic material comprises Co, Fe, NiFe, CoFe, or CoFeB, and the insulator material comprises $Al_2O_3$, MgO, $ZrO_2$, $Ta_2O_3$, $HfO_2$, NiO, or Al in some embodiments. The free layer has its magnetization directions floating, while the pinned layer has its magnetization directions fixed.

Depending on the deposition angle, the MTJ layer 110b has a sidewall slope angle ranging from 80°-90°. The slope angle of the of the MTJ 110b can be controlled by the top electrode layer 108 thickness, the size of the opening 107 of the top electrode layer 108, and the deposition direction (shown by arrows).

In some embodiments, the MTJ layer 110b sidewall angle is 80°-87°, and there is also MTJ layer deposition 111 on the sidewall of the opening 107 of the top electrode layer 108 with a width w ranging from 10 Å to 50 Å.

Figure 1F:
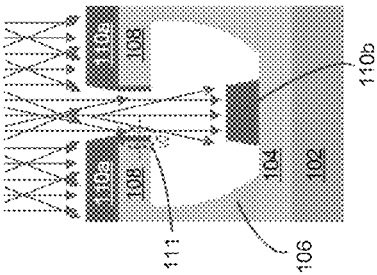

In FIG. 1F, a top electrode pillar 113 is deposited by PVD, for example. The top electrode pillar 113 is deposited as a part of another top electrode layer 112 deposition that has a thickness range from 300 Å to 400 Å in some embodiments. The top electrode pillar 113 comprises Ta in some embodiments, and has a height H ranging from 50 Å to 200 Å. The top electrode pillar 113 has a sidewall angle ranging from 80°-90°. In some embodiments, the top electrode pillar 113 sidewall angle is 80°-87°.

Figure 1I:
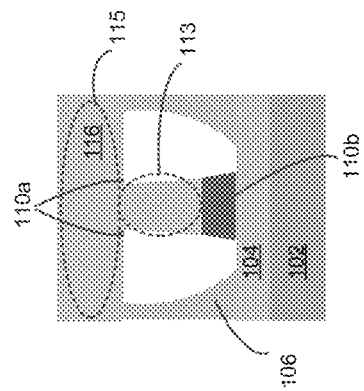
Figure 1H:
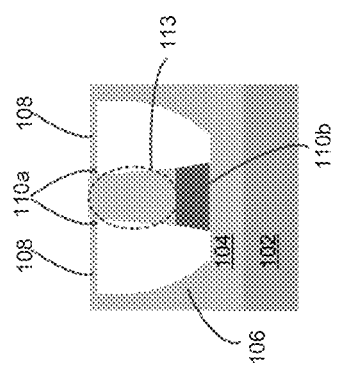
Figure 1G:
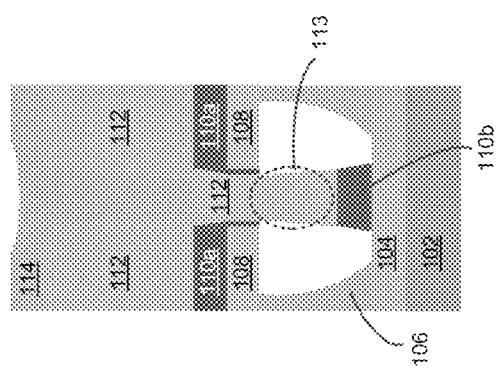

In FIG. 1G, another dielectric layer 114 is deposited over the top electrode layer 112 by chemical vapor deposition (CVD) or PVD, for example. The dielectric layer 114 can comprise $SiO_2$, SiN, or any other suitable material.

In FIG. 1H, a polishing process is performed to remove the layers above the bottom portion of the top electrode layer 108 by chemical mechanical polishing (CMP), for example. In some embodiments, the thickness of the remaining bottom portion of the top electrode layer 108 ranges from 50 Å to 100 Å. There are still portions of MTJ layer 110a remaining in some embodiments.

In FIG. 1I, another top electrode layer (e.g., Ta) is deposited over the remaining bottom portion of the top electrode layer 108 to form the top electrode 116. The top electrode 116 is T-shaped and includes a pillar portion 113 and a horizontal layer portion 115 in some embodiments. The remaining MTJ layer portion 110a at the corners of the pillar portion 113 and the horizontal layer portion 115 of the top electrode 116 has a width ranging from 10 Å to 50 Å with a thickness ranging from 50 Å to 100 Å in some embodiments.

Because the MTJ device fabrication method in FIGS. 1A-1I is performed by a casting approach (i.e., the structure shape is formed by filling in a space and removing unnecessary material), instead of a conventional approach (e.g., the structure shape is formed by photoresist patterning and removing material), there is reduced plasma damage and by-product on the MTJ layer 110b sidewall, and the MTJ layer 110b quality after the MTJ device formation can be kept the same as just after deposition of the MTJ layer 110b.

The deposition of the MTJ layer 110b and etching of the opening 109 space is determined by the opening 107 in the top electrode layer 108 in FIG. 1B, and the MTJ layer 110b shape and the opening 109 space can be controlled by the etching process with self-alignment. The opening 109 space has a U-shape in some embodiments.

Figure 2A:
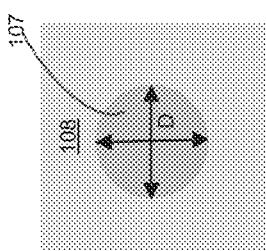
FIGS. 2A and 2B are top views of the exemplary MTJ device in FIG. 1B according to some embodiments.
Figure 2B:
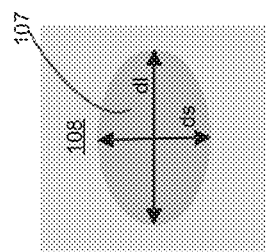

FIGS. 2A and 2B are top views of the exemplary MTJ device in FIG. 1B according to some embodiments. In FIG. 2A, the opening 107 in the top electrode layer 108 has a circular shape with a diameter D ranging from 40 nm to 50 nm in some embodiments. The resulting MTJ layer 110b in FIG. 1I will have a similar shape.

In FIG. 2B, the opening 107 in the top electrode layer 108 has an elliptic or oval shape with a long axis length dl ranging from 140 nm to 150 nm and a short axis length ds ranging from 40 nm to 50 nm. The resulting MTJ layer 110b in FIG. 1I will have a similar shape. In some other embodiments, the opening 107 and the MTJ layer 110b may have a different shape and/or size.

According to some embodiments, a method includes creating an opening in a dielectric layer that is disposed over a bottom electrode layer. A top electrode layer is disposed over the dielectric layer. A magnetic tunnel junction (MTJ) layer is formed in the opening over the bottom electrode layer.

According to some embodiments, a magnetic tunnel junction (MTJ) device includes a substrate, a bottom electrode layer disposed over the substrate, a MTJ layer disposed over the bottom electrode layer, and a top electrode disposed over the MTJ layer. The top electrode is T-shaped.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   creating a first opening in a first dielectric layer that is disposed over a bottom electrode layer, wherein a first top electrode layer is disposed over the first dielectric layer;
   creating a second opening in the first top electrode layer prior to creating the first opening, wherein the second opening has a narrower width than the first opening; and
   forming a magnetic tunnel junction (MTJ) layer in the first opening over the bottom electrode layer.

2. The method of claim 1, wherein creating the first opening comprises performing a wet etching process in the first dielectric layer.

3. The method of claim 2, wherein creating the first opening further comprises performing a dry etching process in the first dielectric layer prior to the wet etching process.

4. The method of claim 1, wherein the the MTJ layer comprises a pinned layer, a barrier layer and a free layer.

5. The method of claim 1, wherein the second opening is created by a photolithography process and a dry etching process.

6. The method of claim 1, further comprising depositing a top electrode pillar over the MTJ layer.

7. The method of claim 6, further comprising depositing a second dielectric layer over the top electrode pillar.

8. The method of claim 6, wherein the top electrode pillar is deposited by a physical vapor deposition (PVD) process.

9. The method of claim 1, further comprising performing a polishing process to remove a portion of the first top electrode layer.

10. The method of claim 9, further comprising depositing a second top electrode layer over a remaining portion of the first top electrode layer.

11. The method of claim 1, wherein the MTJ layer is deposited by a physical vapor deposition (PVD) process.

12. The method of claim 1, further comprising forming a top electrode that includes a top electrode pillar connecting the first top electrode layer and the MTJ layer, a bottom portion of the first top electrode layer, and a second top electrode layer disposed over the bottom portion of the first top electrode layer.

13. A method, comprising:
   creating a first opening in a first top electrode layer, wherein the first top electrode layer is disposed over a dielectric layer and the dielectric layer is disposed over a bottom electrode layer;
   creating a second opening in the dielectric layer, wherein the second opening has a width greater than the first opening;
   forming a magnetic tunnel junction (MTJ) layer in the second opening over the bottom electrode layer; and
   forming a top electrode connecting the first top electrode layer and the MTJ layer, the top electrode including a top electrode pillar over the MTJ layer, a bottom portion of the first top electrode layer, and a second top electrode layer disposed over the bottom portion of the first top electrode layer and the top electrode pillar.

14. The method of claim 13, wherein creating the second opening comprises performing a wet etching process in the dielectric layer.

15. A method, comprising:
forming a bottom electrode layer on a major surface of a substrate;
forming a dielectric layer on the bottom electrode layer;
forming a top electrode layer on the dielectric layer;
forming a first opening having a first shape and a first outer perimeter, when viewed from a plan view relative the major surface of the substrate, in the top electrode layer;
forming a second opening having a second shape, when viewed from the plan view relative the major surface of the substrate, in the dielectric layer, the second opening being substantially aligned with the first opening and having a second outer perimeter wider than the first outer perimeter;
depositing a magnetic tunnel junction feature having a profile shape within the second opening, the profile shape being an artifact of the first outer perimeter and the second opening perimeter; and
forming a top electrode on the magnetic tunnel junction feature.

16. The method of claim 15, wherein the step of forming a top electrode comprises depositing a top electrode material extending from a top surface of the magnetic tunnel junction feature to above the top electrode layer and removing the top electrode material from above the top electrode layer.

17. The method of claim 16, wherein the step of removing the top electrode material from above the top electrode layer also removes a top portion of the top electrode layer.

18. The method of claim 15, further comprising forming a second dielectric layer above the top electrode.

19. The method of claim 15, wherein the first shape is selected from the group consisting of circular and elliptical.

20. The method of claim 15, wherein the magnetic tunnel junction feature has a sidewall, when viewed in cross sectional view relative the major surface of the substrate, and the sidewall forms an angle, relative the major surface of the substrate, of between about 80° and about 87°.

* * * * *